United States Patent [19]
Niimi

[11] Patent Number: 6,084,974
[45] Date of Patent: Jul. 4, 2000

[54] DIGITAL SIGNAL PROCESSING DEVICE

[75] Inventor: Koji Niimi, Hamamatsu, Japan

[73] Assignee: Yamaha Corporation, Hamamatsu, Japan

[21] Appl. No.: 08/245,206

[22] Filed: May 17, 1994

[30] Foreign Application Priority Data

May 18, 1993 [JP] Japan ................................. 5-139493

[51] Int. Cl.[7] .................................................. H03G 3/00
[52] U.S. Cl. .................................. 381/104; 381/107
[58] Field of Search ............................ 381/55, 104, 107, 381/106, 108, 63; 333/14

[56] References Cited

U.S. PATENT DOCUMENTS

| | | | |
|---|---|---|---|
| 3,350,512 | 10/1967 | Percival | 333/14 |
| 3,535,550 | 10/1970 | Kang | 333/14 |
| 4,562,591 | 12/1985 | Stikvoort | 381/106 |
| 4,696,044 | 9/1987 | Waller | 333/14 |
| 5,073,942 | 12/1991 | Yoshida | 381/63 |
| 5,146,504 | 9/1992 | Pinckley | 381/104 |
| 5,170,437 | 12/1992 | Strahm | 381/107 |
| 5,404,315 | 4/1995 | Nakano | 381/107 |

FOREIGN PATENT DOCUMENTS 2095954  10/1982  United Kingdom ................... 381/106

*Primary Examiner*—Minsun Oh Harvey
*Attorney, Agent, or Firm*—Loeb & Loeb LLP

[57] ABSTRACT

A digital signal processing device includes a rectifier circuit, logarithm conversion circuit, peak-hold/timewise attenuation circuit, gain table, multiplier and timing generation circuit. The rectifier circuit obtains the absolute value of input data. The logarithm conversion circuit converts the linear input data into logarithmic data. The peak-hold/timewise attenuation circuit performs peak-hold and timewise attenuation processes on the instantaneous logarithmic data, to obtain an approximate logarithmic envelope. The gain table which has nonlinear gain characteristic receives the logarithmic data as a readout address, to thereby output a gain value corresponding to the input level. The multiplier multiplies the input data by the gain value so as to provide output data that have been processed in accordance with the nonlinear characteristic.

18 Claims, 15 Drawing Sheets

| INPUT DATA | (dB) | OUTPUT CODE | (dB) |
|---|---|---|---|
| 011111xxxxxxxxx | ( 0.0) | 11111111 | ( −0.0) |
| 011110xxxxxxxxx | ( −0.3) | 11111110 | ( −0.4) |
| 011101xxxxxxxxx | ( −0.6) | 11111101 | ( −0.8) |
| 011100xxxxxxxxx | ( −0.9) | 11111100 | ( −1.1) |
| 011011xxxxxxxxx | ( −1.2) | 11111011 | ( −1.5) |
| 011010xxxxxxxxx | ( −1.5) | 11111010 | ( −1.9) |
| 011001xxxxxxxxx | ( −1.9) | 11111001 | ( −2.3) |
| 011000xxxxxxxxx | ( −2.2) | 11111000 | ( −2.6) |
| 010111xxxxxxxxx | ( −2.6) | 11110111 | ( −3.0) |
| 010110xxxxxxxxx | ( −3.0) | 11110110 | ( −3.4) |
| 010101xxxxxxxxx | ( −3.4) | 11110101 | ( −3.8) |
| 010100xxxxxxxxx | ( −3.8) | 11110100 | ( −4.1) |
| 010011xxxxxxxxx | ( −4.3) | 11110011 | ( −4.5) |
| 010010xxxxxxxxx | ( −4.7) | 11110010 | ( −4.9) |
| 010001xxxxxxxxx | ( −5.2) | 11110001 | ( −5.3) |
| 010000xxxxxxxxx | ( −5.7) | 11110000 | ( −5.6) |
| | | | |
| 0011111xxxxxxxx | ( −6.0) | 11101111 | ( −6.0) |
| 0011110xxxxxxxx | ( −6.3) | 11101110 | ( −6.4) |
| 0011101xxxxxxxx | ( −6.6) | 11101101 | ( −6.8) |
| ⋮ | | | |
| 000000000000111 | (−73.1) | 00111100 | (−73.4) |
| 000000000000110 | (−74.5) | 00111000 | (−74.9) |
| 000000000000101 | (−76.1) | 00110100 | (−76.4) |
| 000000000000100 | (−78.0) | 00110000 | (−77.9) |
| 000000000000011 | (−80.5) | 00101000 | (−80.9) |
| 000000000000010 | (−84.0) | 00100000 | (−83.9) |
| 000000000000001 | (−90.0) | 00010000 | (−89.9) |
| | | | |
| 000000000000000 | (−) | 00000000 | (−95.9) |

FIG. 4

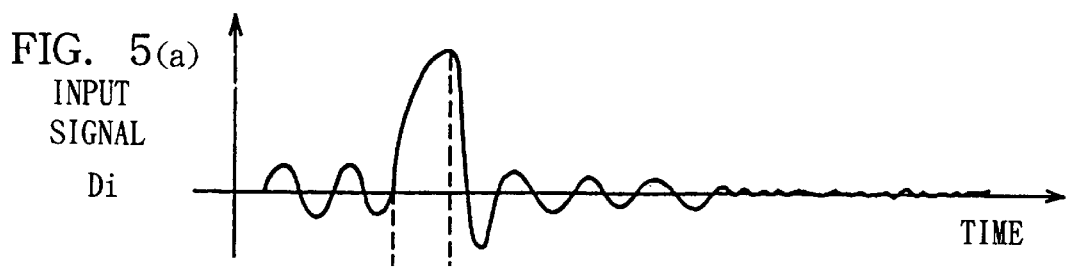
FIG. 5(a) INPUT SIGNAL Di
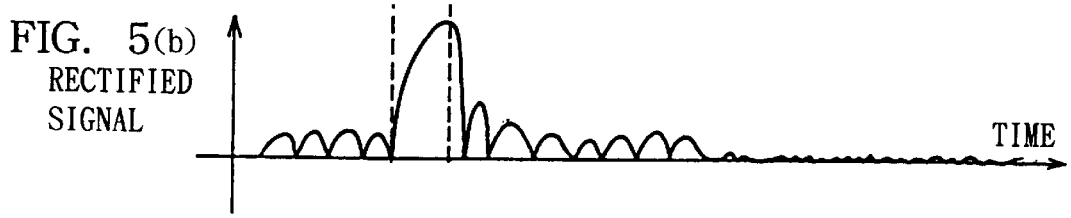
FIG. 5(b) RECTIFIED SIGNAL
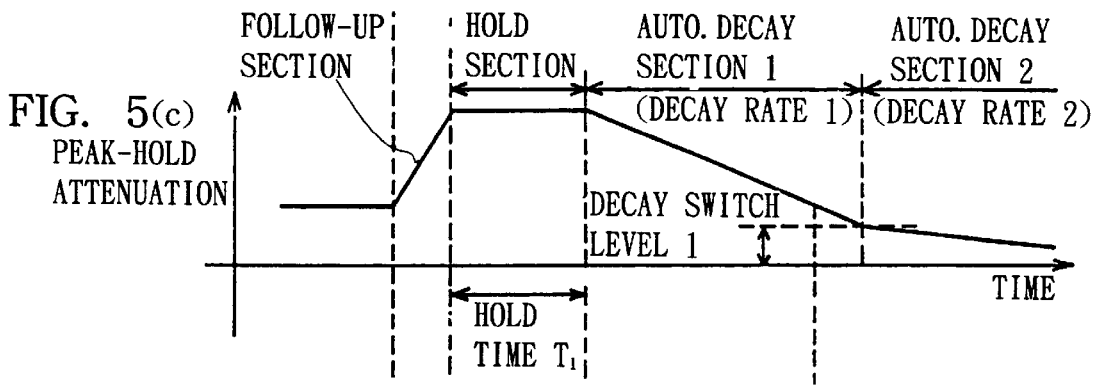
FIG. 5(c) PEAK-HOLD ATTENUATION
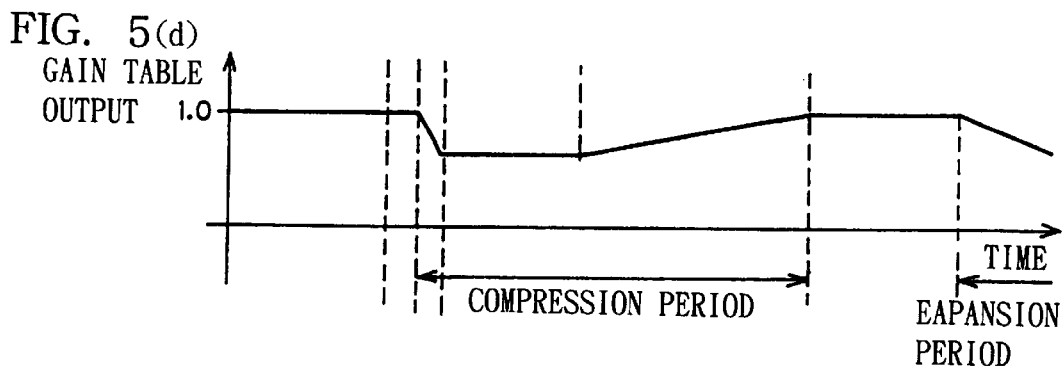
FIG. 5(d) GAIN TABLE OUTPUT
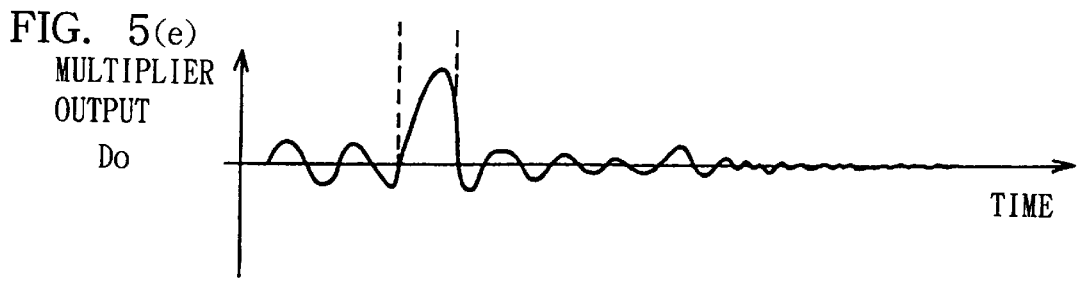
FIG. 5(e) MULTIPLIER OUTPUT Do

| ADDRESS (HEXADECIMAL) | TABLE VALUE (HEXADECIMAL) | REAL NUMBER | dB REPRESENTATION |
|---|---|---|---|
| ff | 2000 | 1.000 | 0.0 dB |
| fe | 20b3 | 1.022 | 0.2 dB |
| fd | 216a | 1.044 | 0.4 dB |
| fc | 2226 | 1.067 | 0.6 dB |
| fb | 22e5 | 1.091 | 0.8 dB |
| fa | 23a9 | 1.114 | 0.9 dB |
| f9 | 2470 | 1.139 | 1.1 dB |
| f8 | 253d | 1.164 | 1.3 dB |
| f7 | 260d | 1.189 | 1.5 dB |
| f6 | 26e3 | 1.215 | 1.7 dB |
| f5 | 27bd | 1.242 | 1.9 dB |
| f4 | 289c | 1.269 | 2.1 dB |
| f3 | 297f | 1.297 | 2.3 dB |
| f2 | 2a68 | 1.325 | 2.4 dB |
| f1 | 2b56 | 1.354 | 2.6 dB |
| f0 | 2c48 | 1.384 | 2.8 dB |
| ef | 2d41 | 1.414 | 3.0 dB |
| ee | 2e3e | 1.445 | 3.2 dB |
| ed | 2f42 | 1.477 | 3.4 dB |
| ec | 304b | 1.509 | 3.6 dB |
| eb | 3159 | 1.542 | 3.8 dB |
| ea | 326e | 1.576 | 4.0 dB |
| e9 | 3389 | 1.610 | 4.1 dB |
| e8 | 34aa | 1.646 | 4.3 dB |
| e7 | 35d1 | 1.682 | 4.5 dB |
| e6 | 36fe | 1.719 | 4.7 dB |
| e5 | 3833 | 1.756 | 4.9 dB |
| e4 | 396e | 1.795 | 5.1 dB |
| e3 | 3ab0 | 1.834 | 5.3 dB |
| e2 | 3bf9 | 1.874 | 5.5 dB |
| e1 | 3d49 | 1.915 | 5.6 dB |
| e0 | 3ea0 | 1.957 | 5.8 dB |

FIG. 8

| ADDRESS (HEXADECIMAL) | TABLE VALUE (HEXADECIMAL) | REAL NUMBER | dB REPRESENTATION |
| --- | --- | --- | --- |
| df | 3fff | 2.000 | 6.0 dB |
| de | 4166 | 2.044 | 6.2 dB |
| dd | 42d5 | 2.089 | 6.4 dB |
| dc | 444c | 2.134 | 6.6 dB |
| db | 45ca | 2.181 | 6.8 dB |
| da | 4752 | 2.229 | 7.0 dB |
| d9 | 48e1 | 2.278 | 7.1 dB |
| d8 | 4a7a | 2.327 | 7.3 dB |
| d7 | 4c1b | 2.378 | 7.5 dB |
| d6 | 4dc6 | 2.430 | 7.7 dB |
| d5 | 4f7a | 2.484 | 7.9 dB |
| d4 | 5138 | 2.538 | 8.1 dB |
| d3 | 52ff | 2.594 | 8.3 dB |
| d2 | 54d0 | 2.650 | 8.5 dB |
| d1 | 56ac | 2.709 | 8.7 dB |
| d0 | 5891 | 2.768 | 8.8 dB |
| cf | 5a82 | 2.828 | 9.0 dB |
| ce | 5c7d | 2.890 | 9.2 dB |
| cd | 5e84 | 2.954 | 9.4 dB |
| cc | 6096 | 3.018 | 9.6 dB |
| cb | 62b3 | 3.084 | 9.8 dB |
| ca | 64dc | 3.152 | 10.0 dB |
| c9 | 6712 | 3.221 | 10.2 dB |
| c8 | 6954 | 3.292 | 10.3 dB |
| c7 | 6ba2 | 3.364 | 10.5 dB |
| c6 | 6dfd | 3.437 | 10.7 dB |
| c5 | 7066 | 3.513 | 10.9 dB |
| c4 | 72dc | 3.589 | 11.1 dB |
| c3 | 7560 | 3.668 | 11.3 dB |
| c2 | 77f2 | 3.748 | 11.5 dB |
| c1 | 7a92 | 3.830 | 11.7 dB |
| c0 | 7d41 | 3.914 | 11.9 dB |
| bf | 7fff | 4.000 | 12.0 dB |
| be | 7fff | 4.000 | 12.0 dB |
| bd | 7fff | 4.000 | 12.0 dB |
| bc | 7fff | 4.000 | 12.0 dB |

FIG. 9

| ADDRESS (HEXADECIMAL) | TABLE VALUE (HEXADECIMAL) | REAL NUMBER | dB REPRESENTATION |
|---|---|---|---|
| 22 | 7fff | 4.000 | 12.0 dB |
| 21 | 7fff | 4.000 | 12.0 dB |
| 20 | 7fff | 4.000 | 12.0 dB |
| 1f | 7fff | 4.000 | 12.0 dB |
| 1e | 7560 | 3.668 | 11.3 dB |
| 1d | 6ba2 | 3.364 | 10.5 dB |
| 1c | 62b3 | 3.084 | 9.8 dB |
| 1b | 5a82 | 2.828 | 9.0 dB |
| 1a | 52ff | 2.594 | 8.3 dB |
| 19 | 4c1b | 2.378 | 7.5 dB |
| 18 | 45ca | 2.181 | 6.8 dB |
| 17 | 3fff | 2.000 | 6.0 dB |
| 16 | 3ab0 | 1.834 | 5.3 dB |
| 15 | 35d1 | 1.682 | 4.5 dB |
| 14 | 3159 | 1.542 | 3.8 dB |
| 13 | 2d41 | 1.414 | 3.0 dB |
| 12 | 297f | 1.297 | 2.3 dB |
| 11 | 260d | 1.189 | 1.5 dB |
| 10 | 22e5 | 1.091 | 0.8 dB |
| 0f | 2000 | 1.000 | 0.0 dB |
| 0e | 1d58 | 0.917 | -0.8 dB |
| 0d | 1ae8 | 0.841 | -1.5 dB |
| 0c | 18ac | 0.771 | -2.3 dB |
| 0b | 16a0 | 0.707 | -3.0 dB |
| 0a | 14bf | 0.648 | -3.8 dB |
| 09 | 1306 | 0.595 | -4.5 dB |
| 08 | 1172 | 0.545 | -5.3 dB |
| 07 | 1000 | 0.500 | -6.0 dB |
| 06 | 0eac | 0.459 | -6.8 dB |
| 05 | 0d74 | 0.420 | -7.5 dB |
| 04 | 0c56 | 0.386 | -8.3 dB |
| 03 | 0b50 | 0.354 | -9.0 dB |
| 02 | 0a5f | 0.324 | -9.8 dB |

FIG. 10

DIGITAL SIGNAL PROCESSING DEVICE

BACKGROUND OF THE INVENTION

The present invention relates to digital signal processing devices such as a digital compressor/limiter and an acoustic-signal-effect-imparting device (effector).

Digital signal processing devices which perform non-linear gain control in accordance with the level of input signal are commonly known, such as a digital compressor/limiter for performing a compressor (compression) or limiter process on high-amplitude input signal in order to prevent undesirable overmodulation from being caused by broadcasting equipment, and an expander/noise gate for, to effectively reproduce music sound in background noises, suppressing low-level noise while performing an expander (expansion) process on low-amplitude signal.

FIG. 16 is a diagram showing an example of an input-output characteristic of such a digital signal processing device. In this diagram, the horizontal axis represents the logarithmic levels of input signals while the vertical axis represents the logarithmic levels of these signals after having passed through the processing device, and the dotted line represents the input-output characteristic of the signals observed when no compression or expansion process is performed by the processing device. Further, FIG. 17A shows logarithmic gains over input signal levels and FIG. 17B shows linear multiplication coefficients over input signal levels.

With such an input-output characteristic, the gain varies as follows depending on the input signal levels:

(1) if an intermediate-level signal (−24 dB to −84 dB) is input, tone volume is increased with an input-output gain of +12 dB;

(2) if a high-level signal (more than −24 dB) is input, compression at a ½ compression ratio is performed to prevent clipping at high amplitudes; and (3) if a low-level signal (less than −84 dB) is input, expansion at a ½ expansion ratio is performed, but low-level noise with no signal is suppressed.

However, in the past, complicated calculation or operation circuitry was necessary for achieving such a non-linear gain characteristic.

If a gain characteristic to be achieved is not "non-linear" as referred to in this specification, i.e., if only compression is performed with a substantially constant compression ratio, or if simple logarithmic compression is performed, for instance, then the characteristic can be realized by simple hardware circuitry without complicated operations. For instance, Japanese Patent Application Laid-open No. HEI 3-218109 of a patent application filed by this assignee discloses a compressor which provides a simple compression arrangement by multiplying the input signal itself by a coefficient that is proportional to the level of the input signal. However, the compression characteristic achieved by the disclosed compressor is limited to a relatively simple characteristic, and thus, if gain characteristics as shown in FIGS. 15 and 17 are to be achieved, it is necessary to perform complicated operations using additional circuitry etc.

As mentioned above, the conventional digital signal processing devices employ operation circuitry to achieve non-linear characteristics. But, the multiplication coefficients change in a complicated manner depending on the varying levels of input signals, and thus, irrespective of whether the operation circuitry employed is analog or digital, the signal processing devices would require complicated and sophisticated operation circuitry. Besides, it was necessary for the user to perform complicated operation of the device in order to change characteristics to be achieved.

SUMMARY OF THE INVENTION

It is therefore an object of the present invention to provide a digital signal processing device which is capable of dealing with signals of a wide dynamic range by the use of simple circuitry, without losing a free choice of desired characteristics.

According to a first aspect of the present invention, a digital signal processing device comprises receiving means for receiving an input signal to be processed, the input digital signal having linear gain characteristic, logarithmic conversion means for converting the input digital signal into logarithmic data, the logarithmic data having a non-linear gain characteristic, address generation means for generating a readout address in accordance with the logarithmic data converted by said logarithmic conversion means, storing means for storing a plurality of gain values on the basis of predetermined gain characteristic and for reading out one of the plurality of gain values in response to the readout address generated by said address generation means, and multiplication means for multiplying the input digital signal by the gain value read out by said storing means to provide an output digital signal.

In the signal processing devices, the gain table may comprise a RAM that allows the gain characteristic to be rewritten from outside.

With the digital signal processing device according to the invention, because a gain characteristic is provided by the gain table, complex gain characteristic can be achieved with utmost ease. In addition, because the gain table receives, as a readout address, a digital signal expressed in logarithmic or floating-point representation, it is possible to properly process signals of a wide dynamic range by the use of a small-scale gain table.

Further, according to the invention, because, in addition to the above-mentioned functions, calculation of an approximate envelope of the input signals can be performed in logarithmic code region, even arithmetic operations to provide exponent-functional attenuation in linear region can be performed by linear operation circuitry such as a simple counter, and thus the circuitry structure can be greatly simplified.

Moreover, because the present invention obtains an approximate envelope of the input signal through the peak-hold/timewise attenuation section, there is no time delay which would occur in the case where digital filter or the like is employed, and necessary processing can be performed on the real time basis. Thus, the present invention can facilitate synthesis of sound signals, tone signals or the like.

It should also be appreciated that if the gain table comprises a RAM which is rewritable from outside, a digital signal processing device having a desired gain characteristic can be realized as needed with no modification of the circuitry structure.

Now, the preferred embodiment of the present invention will be described in detail below with reference to the accompanying drawings.

BRIEF DESCRIPTION OF THE DRAWINGS

In the accompanying drawings:

FIG. 4 is a diagram showing input and output data provided to and from the logarithm conversion circuit;

FIG. 5 shows waveforms of signals sequentially processed in various parts of the processing device;

FIG. 8 shows table values contained in a gain table employed in the processing device;

FIG. 9 shows other table values contained in the gain table;

FIG. 10 shows still other table values contained in the gain table;

DETAILED DESCRIPTION OF THE INVENTION

Figure 1:
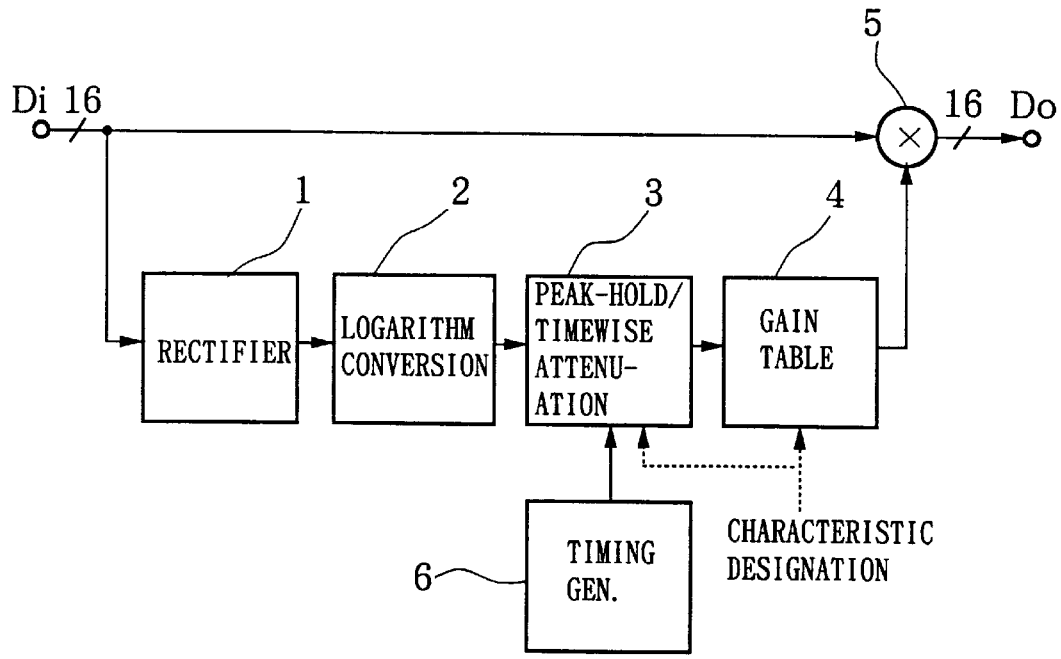
FIG. 1 is a block diagram showing the general structure of a digital signal processing device in accordance with an embodiment of the present invention.

FIG. 1 is a block diagram showing the general structure of a digital signal processing device in accordance with an embodiment of the present invention, which, as shown, generally comprises a rectifier circuit 1, a logarithm conversion circuit 2, a peak-hold/timewise attenuation circuit 3, a gain table 4, a multiplier 5 and a timing generation circuit 6.

Figure 2:
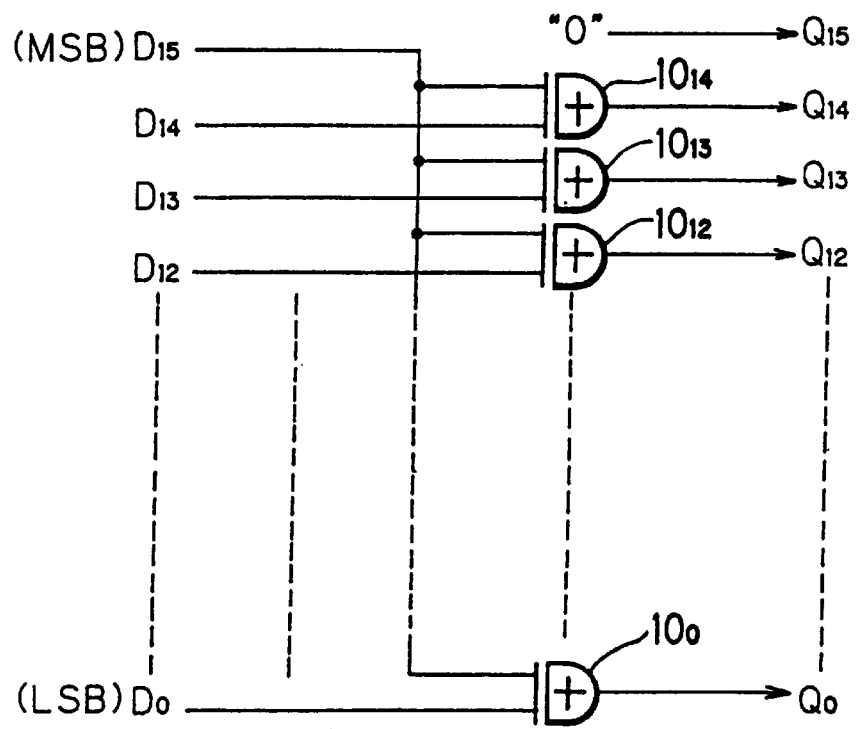
FIG. 2 is a block diagram showing the detail of a rectifier circuit employed in the processing device of FIG. 1.

For example, input data Di is sampled at a sampling frequency of 44.1 kHz has a word length of 16 bits and is formed in two's complement code. The absolute value of the input data Di is obtained by the rectifier circuit 1. As shown in FIG. 2, the rectifier circuit 1 comprises 15 exclusive OR gates $10_0$ to $10_{14}$ which respectively output exclusive ORs between data of the most significant bit (MSB) and the lower bits $D_0$ to $D_{14}$ of the 16-bit input data Di. If the input data Di is of a positive value (namely, MSB($D_{15}$)=0), the rectifier circuit 1 outputs the data of bits $D_{14}$ to $D_0$ as received, but if the input data Di is of a negative value (namely, MSB ($D_{15}$)=1), the circuit 1 inverts the data of bits $D_{14}$ to $D_0$ and fix the MSB($D_{15}$) to "0" so as to output 16 bit absolute value data.

Figure 3:
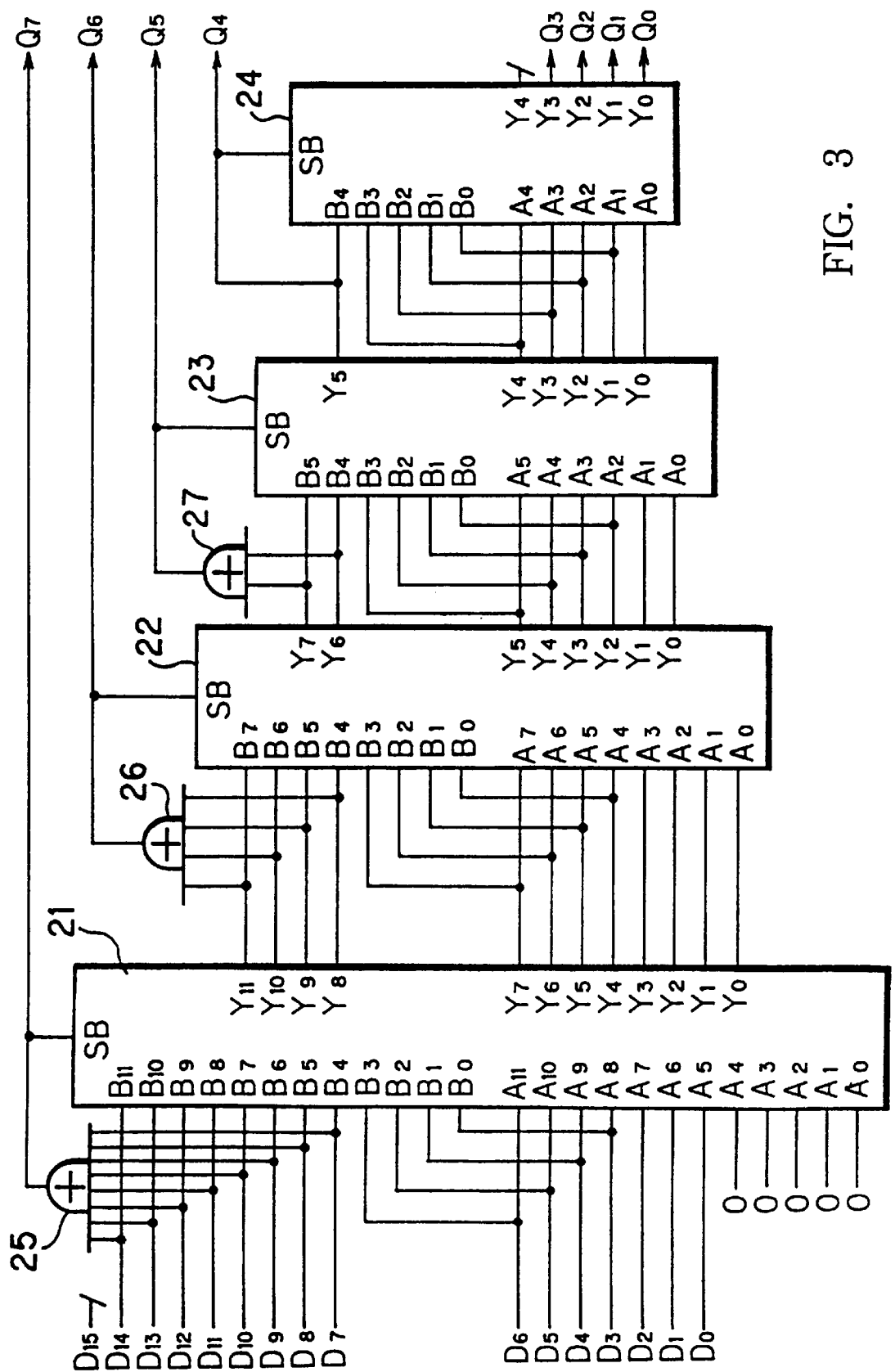
FIG. 3 is a block diagram showing the detail of a logarithm conversion circuit in the processing device.

The 16-bit linear absolute value data output from the rectifier circuit 1 is supplied to the logarithm conversion circuit 2, where the data is converted into an 8-bit logarithmic data. As shown in FIG. 3, this logarithm conversion circuit 2 comprises four selectors 21, 22, 23, 24 and three OR gates 25, 26, 27. Each of the selectors 21, 22, 23, 24 performs a selection operation such that Yi equals Bi when SB=1, but Yi equals Ai when SB=0. Thus, the first-stage selector 21 sets output $Q_7$ to "1" and selects $D_{14}$ to $D_3$ to be input from input terminals B11 to B0 if data "1" is present at any of eight bits $D_{14}$ to $D_7$, but the selector 21 sets output $Q_7$ to "0" and selects $D_6$, $D_5$, $D_4$, $D_3$, $D_2$, $D_1$ and $D_0$ and 0, 0, 0, 0, 0 to be input from input terminals A11 to A0 if data "1" is not present at any of the eight bits $D_{14}$ to $D_7$. At this time, the MSB ($D_{15}$) is not referred to since it is fixed at "0" as mentioned. Similarly, the second-stage selector 22 selects either $Y_{11}$ to $Y_4$ or $Y_7$ to $Y_0$ depending on whether or not data "1" is present at any of the upper four bits $Y_{11}$ to $Y_8$, the third-stage selector 23 selects either $Y_7$ to $Y_2$ or $Y_5$ to $Y_0$ depending on whether or not data "1" is present at any of the upper two bits $Y_7$ and $Y_6$, and the fourth-stage selector 24 selects either $Y_5$ to $Y_1$ or $Y_4$ to $Y_0$ depending on whether or not the upper bit $Y_5$ is at "1".

In the above-mentioned manner, the 16-bit linear data is converted to 8-bit logarithmic data, as shown in FIG. 4. Of the output (code) data $Q_7$ to $Q_0$, the upper four bits $Q_7$, $Q_6$, $Q_5$, $Q_4$ (binary) represent the inverted value of value (X–1) in the case where "1" has first appeard at an X-th bit ("X" is decimal) from the second uppermost bit (D14) of the input data, while the lower four bits $Q_3$ to $Q_0$ are the same as 4-bit data following a bit at which "1" has first appeared as viewed from the MSB side of the input data. From another point of view, this conversion is substantially equivalent to converting a 16-bit linear code in fixed point representation to an 8-bit code in floating-point representation, and the upper four bits and lower four bits of the output data can be considered as an exponent portion and a mantissa portion, respectively. That is, with a slight difference ignored, conversion of the linear code to the code in floating-point representation is practically the same as conversion of the linear code to the logarithmic code. So, in the event that the input data is coded in floating-point representation from the beginning, it is only sufficient that the logarithm conversion circuit 2 uses only the upper bits of the mantissa portion with the sign ignored. In this sense, the basic operation of the embodiment will remain the same even if the logarithm conversion circuit is replaced by a floating-point circuit.

In the input data shown in FIG. 4, as asterisk mark "*" represents a bit to be ignored, and each value in parentheses is a logical value of a relative logarithmic level obtained on the assumption that "7FFF" (hexadecimal) is 0 dB. Further, in the output code (data), each value in parentheses is a value calculated on the assumption that FF (hexadecimal) is 0 dB and one 1 LSB is –0.376 dB. As may be clear from this figure, the output data are logarithmically converted from the corresponding input data with errors within a tolerance of 0.5 dB, thus providing practically sufficient results.

Subsequently, the 8-bit logarithmic code is provided to the peak-hold/timewise attenuation circuit 3, which in turn performs peak-hold and timewise attenuation processes on the input instantaneous logarithmic data so as to obtain an approximate logarithmic envelope. First, the basic operation of this circuit 3 will be described below on the basis of waveform diagrams shown in FIG. 5.

The input signals shown in item (a) of FIG. 5 are rectified in a manner as shown in item (b) by the rectifier circuit 2, then converted into logarithmic representation by the logarithmic conversion circuit 1 and subsequently processed by the peak-hold/timewise attenuation circuit 3 to obtain an approximate logarithmic envelope as shown in item (c) of FIG. 5.

In item (c) of FIG. 5, a "follow-up" section is a section where the logarithmic level of converted codes increase in magnitude as the sample value levels of the input signals increase. A "hold section" is a section where, although the sample value levels of the input signals decrease, the output signals continue to take on a last-detected peak-hold level. The duration of the hold section is determined by a parameter (hold time parameter T1) supplied from outside. In the hold section, the data is not renewed until the input signal newly exceeds the hold level, so that any valley portions of the rectified sinusoidal wave are masked. Once the input signal newly exceeds the peak-hold level, the output code is renewed and then another new hold section starts. In this sense, the above-mentioned follow-up section can also be considered to be such a section where renewal of the output data takes place for each sample.

Upon termination of the hold section, there comes an automatic decay section which, in this embodiment, can be divided into an "automatic decay section 1" and "automatic decay section 2" depending on whether or not the current logarithmic level data is greater in value than a parameter (decay switch level parameter L1) supplied from outside. The decay sections 1 and 2 provide different decay rates R1 and R2, respectively, which are also supplied from outside.

By utilizing signals having adjusted decay time constant etc. instead of an exact envelope of the instantaneous logarithmic codes in the mentioned manner, it is possible to effectively restrain a so-called breathing phenomenon (i.e., an unpleasant phenomenon where levels of noise and background sound fluctuate little by little in response to fluctuation of signals) which would undesirably occur in the conventional compressor/limiter. To provide an appropriate "hold section" is very effective in preventing such a breathing phenomenon, and the reason for switching the decay rates depending on the signal level is that an aurally appropriate decay rate usually differs between compressions at high signal levels and at low signal levels.

Figure 6:
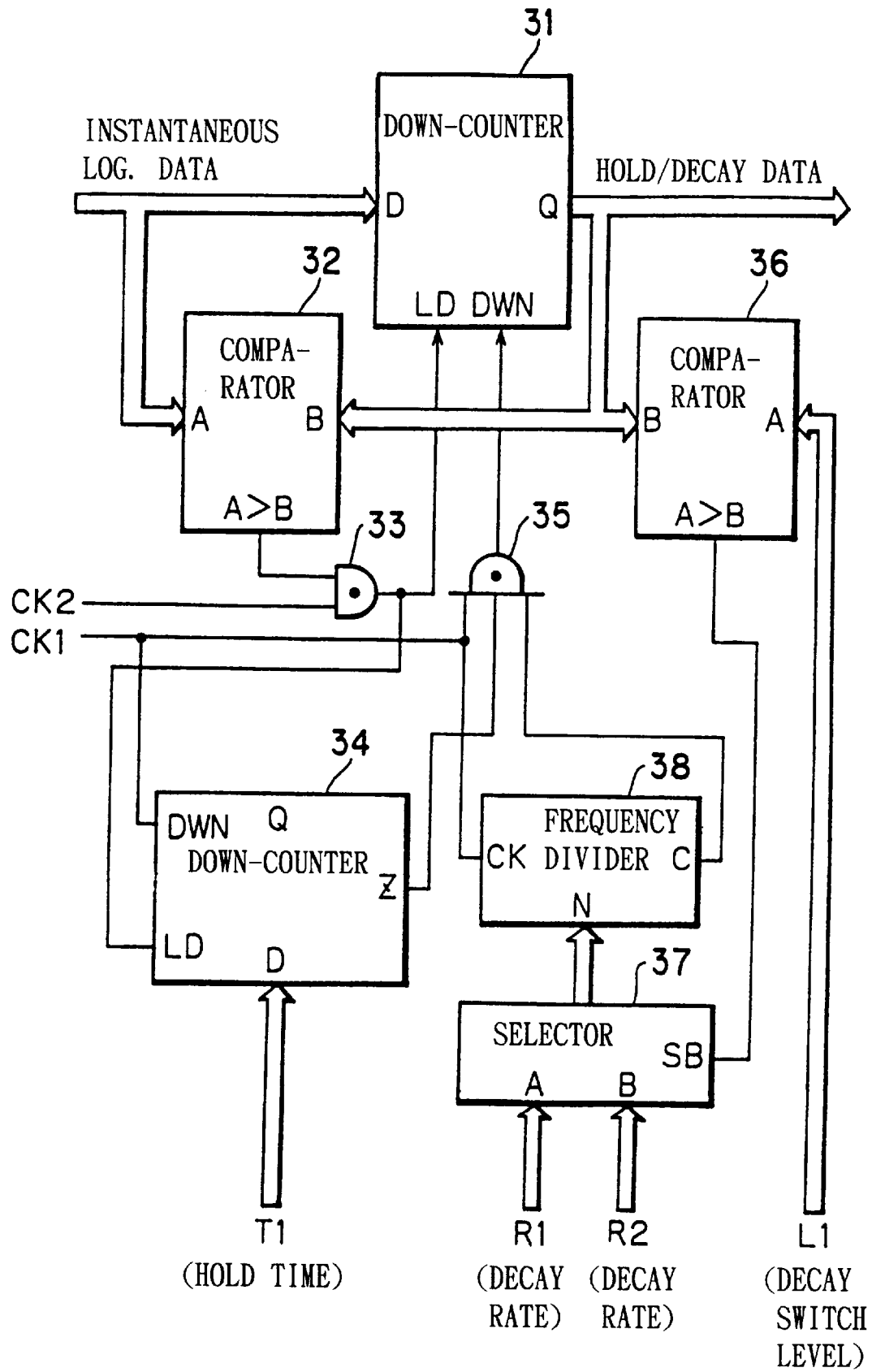
FIG. 6 is a block diagram showing the detail of a peak-hold/timewise attenuation circuit in the processing device.
Figure 7:
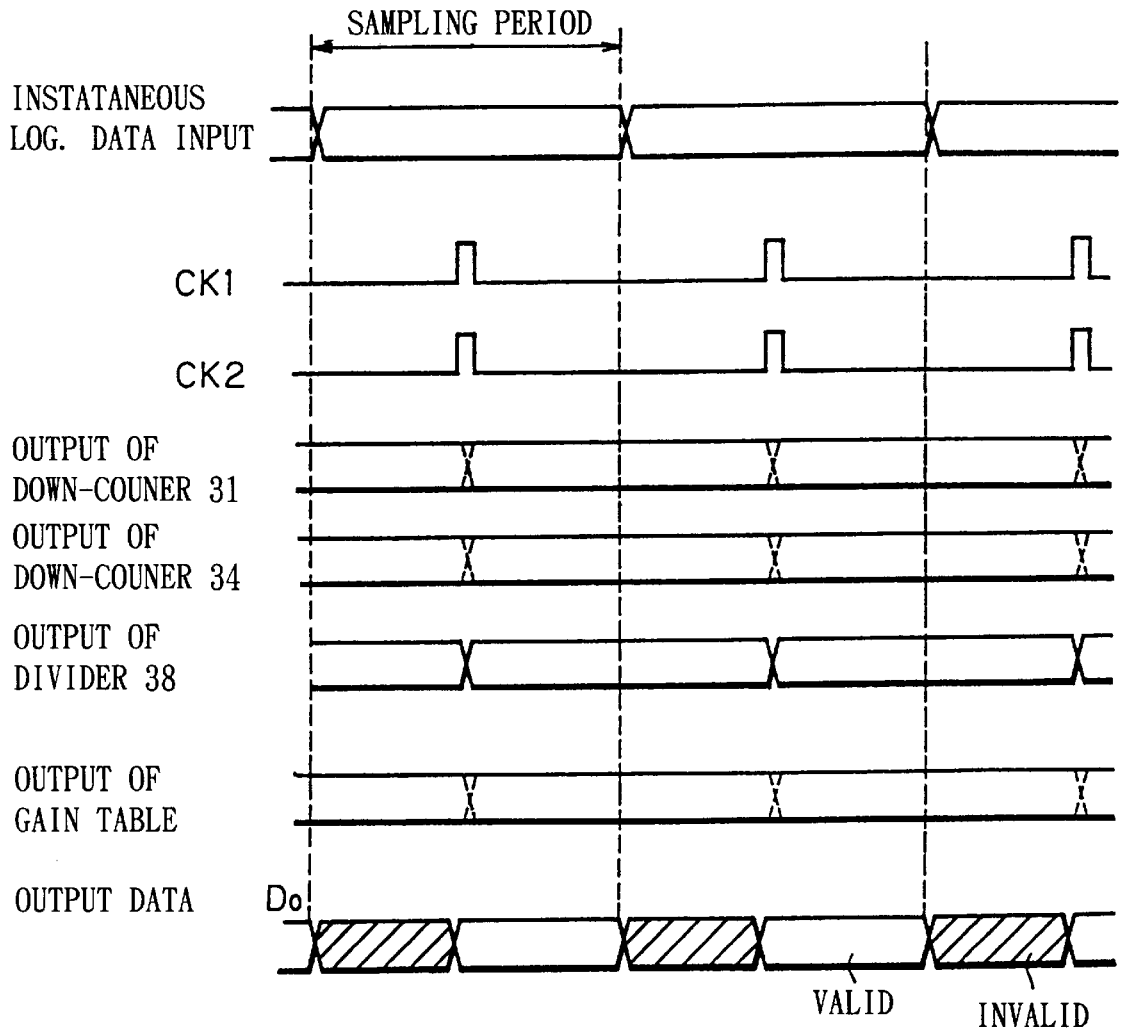
FIG. 7 is a timing chart explanatory of the operation of the peak hold/timewise attenuation circuit.

FIG. 6 shows the structural detail of the peak-hold/timewise attenuation circuit 3, and FIG. 7 is a timing chart explanatory of the operation of the circuit 3.

The instantaneous logarithmic data is input to a down-counter 31, as well as to a comparator 32. On the basis of an output from the comparator 32 indicating that the level value of new input data has exceeded that of the current output data, the down-counter 31 loads the new input data therein in synchronism with a clock signal CK1 passed through an AND gate 33. When the input data is smaller in level value than the output data, the input data has no effect, and the comparator 32 outputs "0" so that the last peak value remains held by the down-counter 31.

At the same time as the new input data is loaded into the down-counter 31, a predetermined hold time parameter T1 is loaded into another down-counter 34. The down-counter 34 sets an output Z to "1" once it has counted clock signals CK2 down to a count value corresponding to the hold time T1. This establishes one of conditions for allowing the clock signal CK1 to be input through and AND gate 35 to the down-counter 31. The logical "1" output from the output Z serves to prohibit the down-counter 31 from down-counting during the hold time T1 after having been updated by the new input.

The other condition for allowing the clock signal CK1 to be input to the down-counter 31 is provided by an output from a programmable frequency divider 38. The output from the down-counter 31 is compared by a comparator 36 to the decay rate switch level L1. The comparison result of the comparator 36 is output as a rate-switching signal to a selector 37. The selector 37 selects the decay rate R1 when the rate-switching signal is at "0" (i.e., the output from the down-counter 31 is greater than L1), but it selects the decay rate R2 when the rate-switching signal is at "1" (i.e., the output from the down-counter 31 is smaller than L1). The output from the selector 37 is provided as a frequency division value N to the programmable frequency divider 38. The frequency divider 38 divides the clock signals CK1 by the value N and sets an output C to "1" whenever N clock signals are input thereto. Thus, the AND gate 35 provides the down-counter 31 with count-down pulses whose period is determined by the decay rate R1 or R2, in such a manner that the counting speed of the down-counter 31 can be switched between two speeds.

Figure 16:
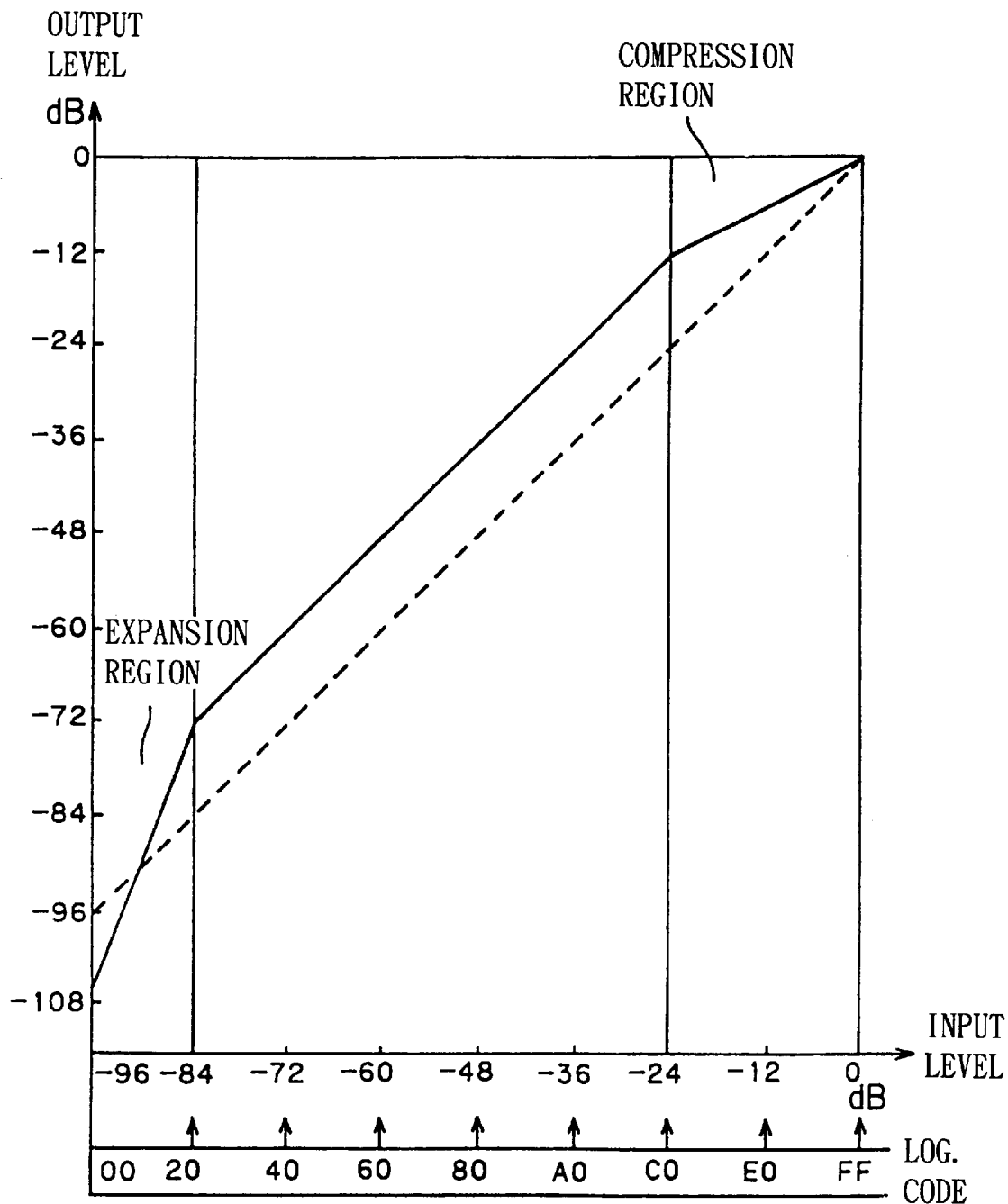
FIG. 16 is a diagram showing an example of an input-output characteristic in the case where the processing device has a nonlinear gain characteristic.
Figure 17A:
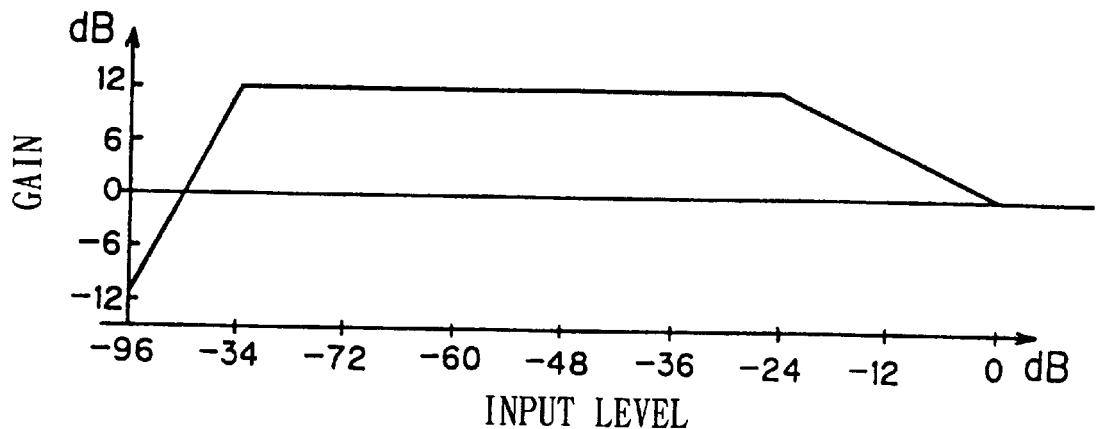
FIG. 17 show a gain characteristic to achieve the input-output characteristic of FIG. 16.
Figure 17B:
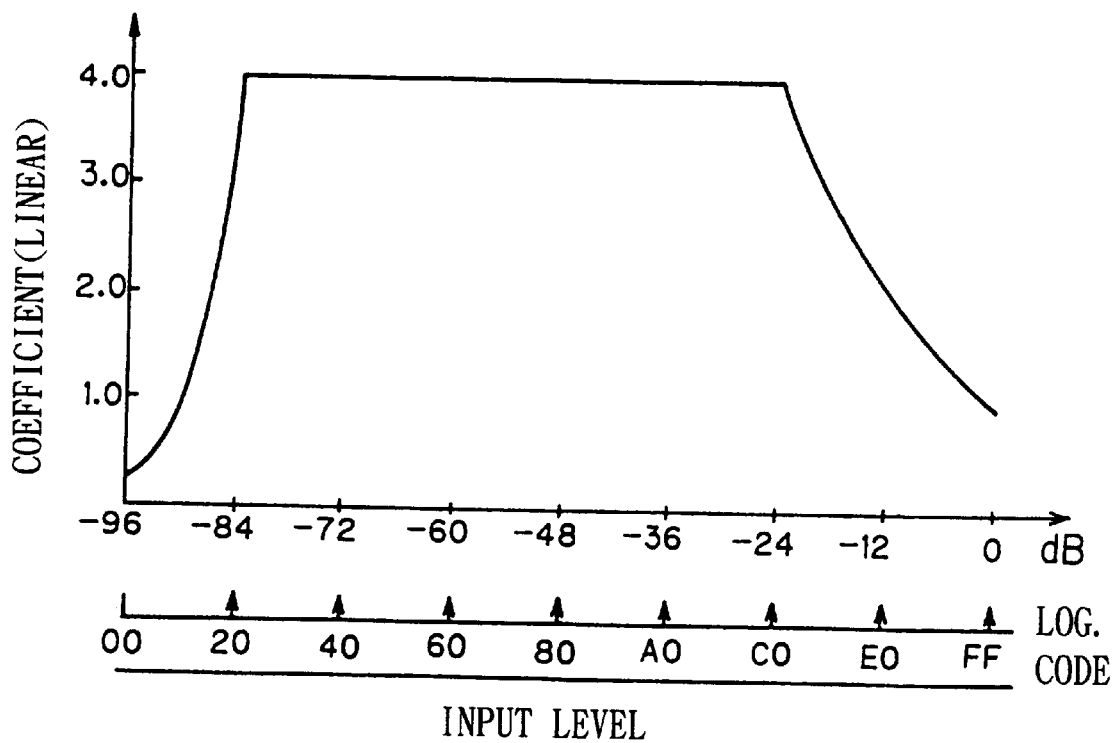

The output of the peak-hold/timewise attenuation circuit 3, which is an 8-bit level code, is provided as a readout address to the gain table 4. The gain table 4 is for example a 256-word table, in which are stored table values as shown in FIGS. 8 to 10. In FIGS. 8 to 10, there are shown, for each readout address, a hexadecimal code, a real number and a value in dB representation. In this embodiment, the gain table is intended for achieving the characteristics as shown in FIGS. 16 and 17 and provides each multiplication coefficient as a 16-bit integer value, with hexadecimal "2000" (decimal 8192) being 1.000 (0.0 dB) shown in FIG. 8, for instance.

Figure 11:
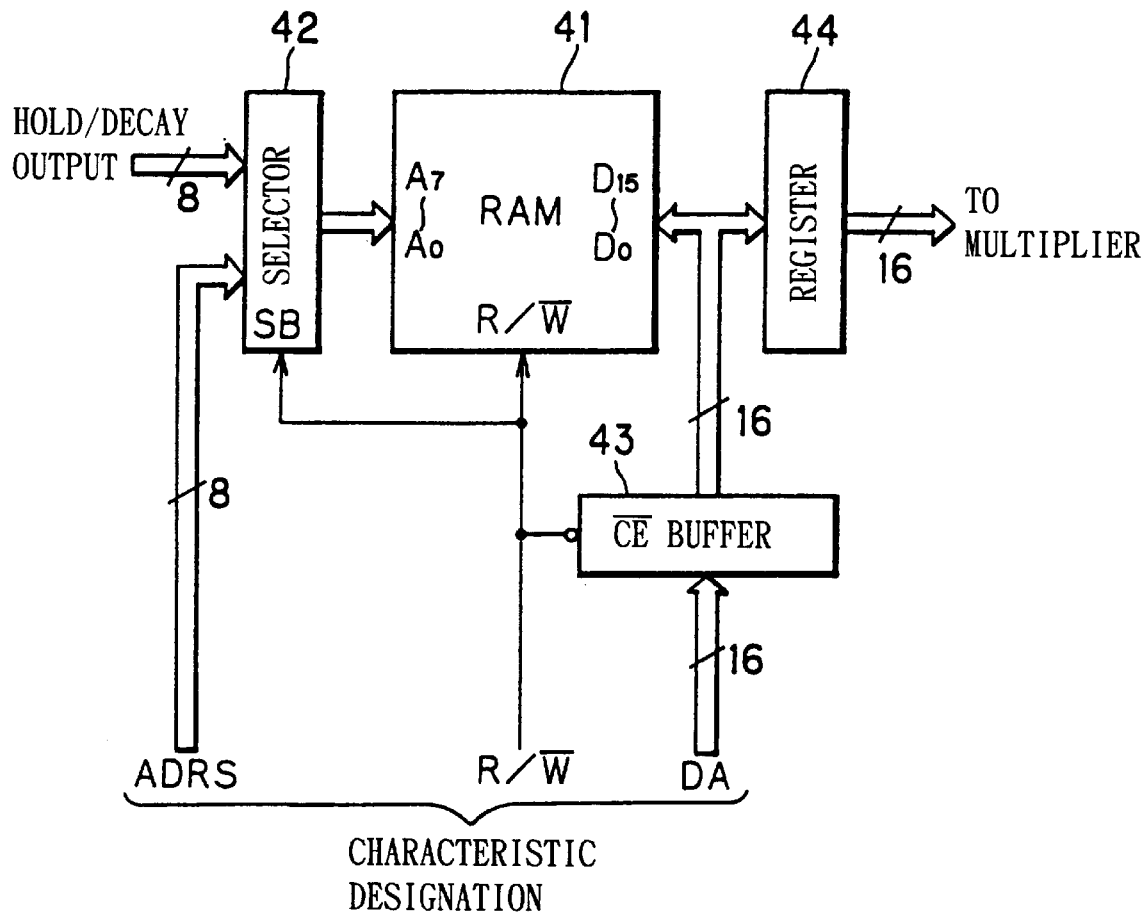
FIG. 11 is a block diagram showing one example of the arrangement of the gain table.

As shown by way of example in FIG. 11, the gain table 4 may comprise a RAM 41 in which a desired gain characteristic is prestored by supplying readout addresses and corresponding data (i.e., gain tables) from an unillustrated microcomputer via a selector 42 and a buffer 43, so that, in operation, the output of the peak-hold/timewise attenuation circuit 3 is provided to the RAM 41 as an address to read out corresponding data (a gain value) from the RAM 41 via a register 44. In this case, the gain characteristic of the device can be varied as desired, by changing the stored data in the gain table 4.

Figure 12:
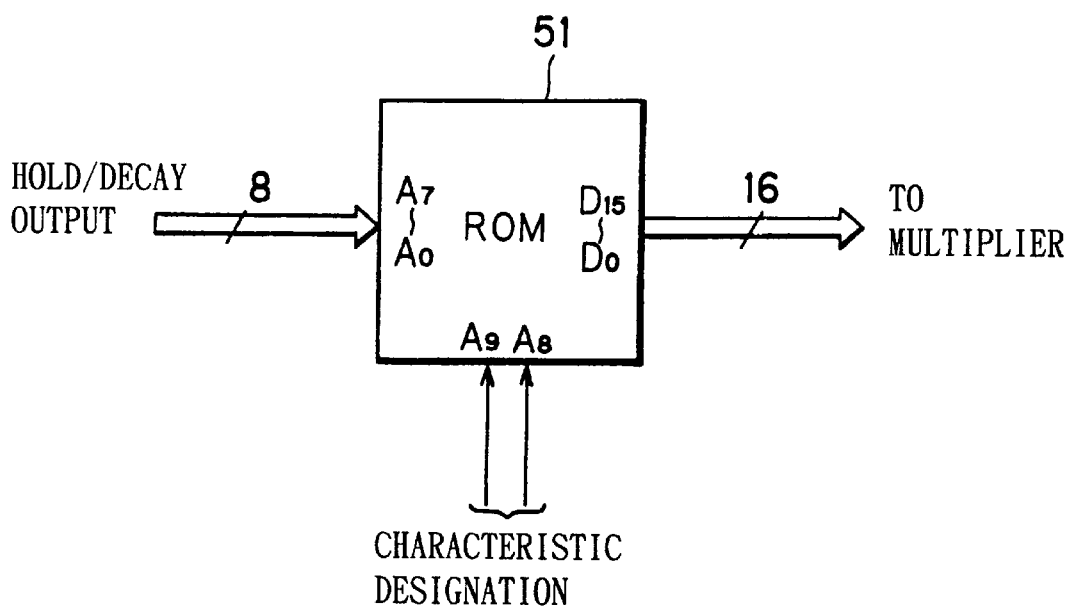
FIG. 12 is a block diagram of another example of the arrangement of the gain table.
Figure 13:
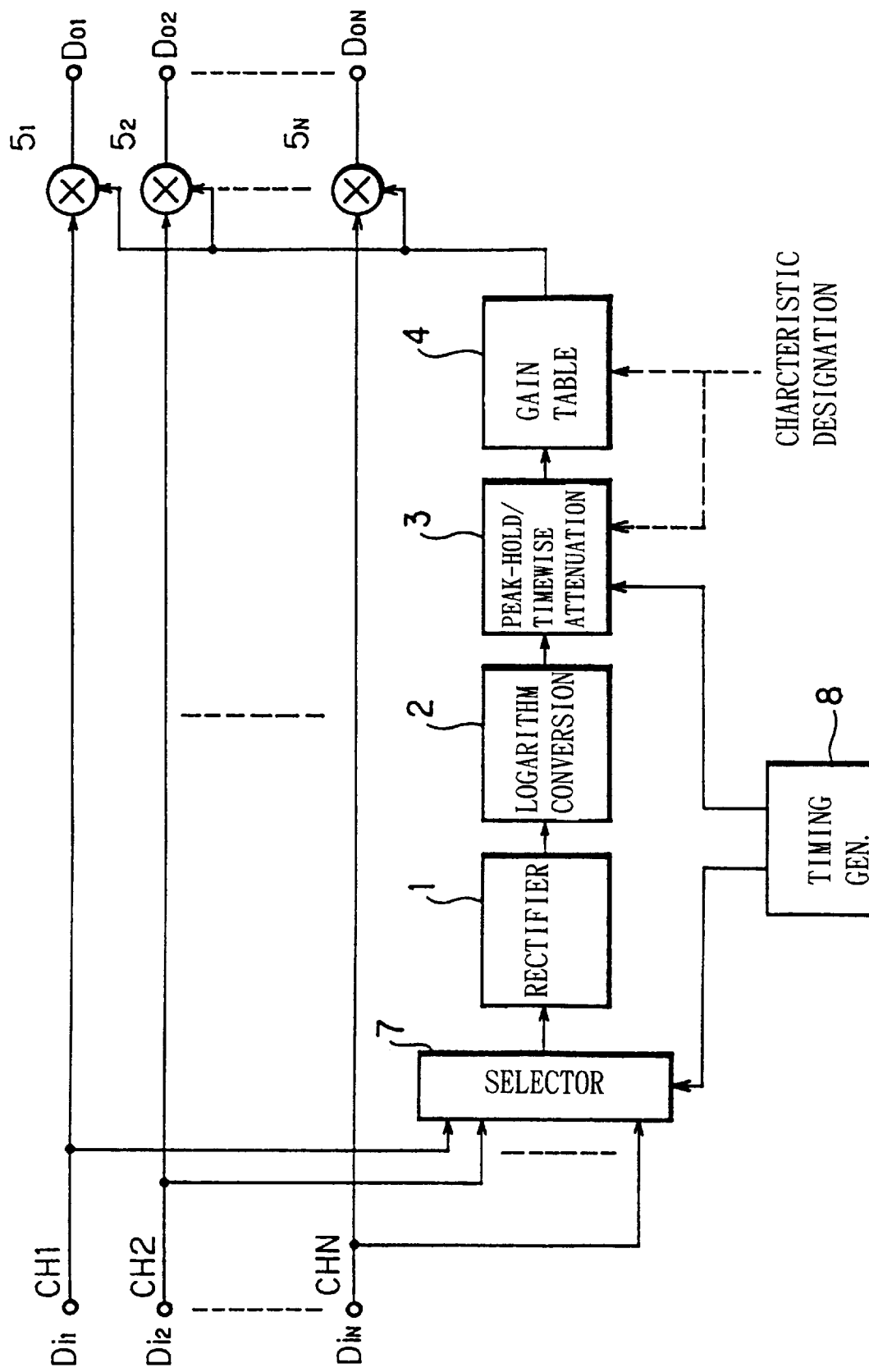
FIG. 13 is a block diagram showing a digital signal processing device in accordance with another embodiment of the present invention.

Alternatively, as shown in FIG. 12, plural gain characteristics may be written in advance in a ROM 51 so that any desired gain characteristic is selected by supplying the upper 2-bit address signal, as a characteristic selection parameter, from the unillustrated microcomputer or the like.

As shown in item (d) of FIG. 5, the gain value output from the gain table 4 change at substantially the same timings as the output from the peak-hold/timewise attenuation circuit 3. Each output of, for example 16 bits, from the gain table 4 is multiplied in the multiplier 5 with the 16-bit input data Di to compress or expand the level value of the input signal in accordance with a desired gain characteristic. In this manner, the levels of the input signals are compressed or expanded in accordance with the desired gain characteristic and consequently output data $D_0$ are obtained as shown in item (e) of FIG. 5.

The embodiment has been described so far in connection with the case where the signal input/output system has only one (mono) channel. However, the invention is also applicable to the case where the signal input/output system has a plurality of (multi) channels, in which case it is sufficient that the above-mentioned compression/expansion process is performed on the basis of signal of a channel where signal amplitude is the greatest. The greatest signal amplitude value may be calculated in linear region, but in such a case the calculation will become large-scale due to the long word lengths. Therefore, this embodiment detects the greatest signal amplitude value by the use of data after having been converted into logarithmic data, to reduce the word lengths. In practice, the above-mentioned peak-hold/timewise attenuation circuit 3 contains a circuit that is equivalent to a component for detecting the greatest signal amplitude value, and thus it is possible to properly deal with the plural channels by only inserting the selector 7 in the input stage and slightly modifying the timing generation circuit 8.

Figure 14:
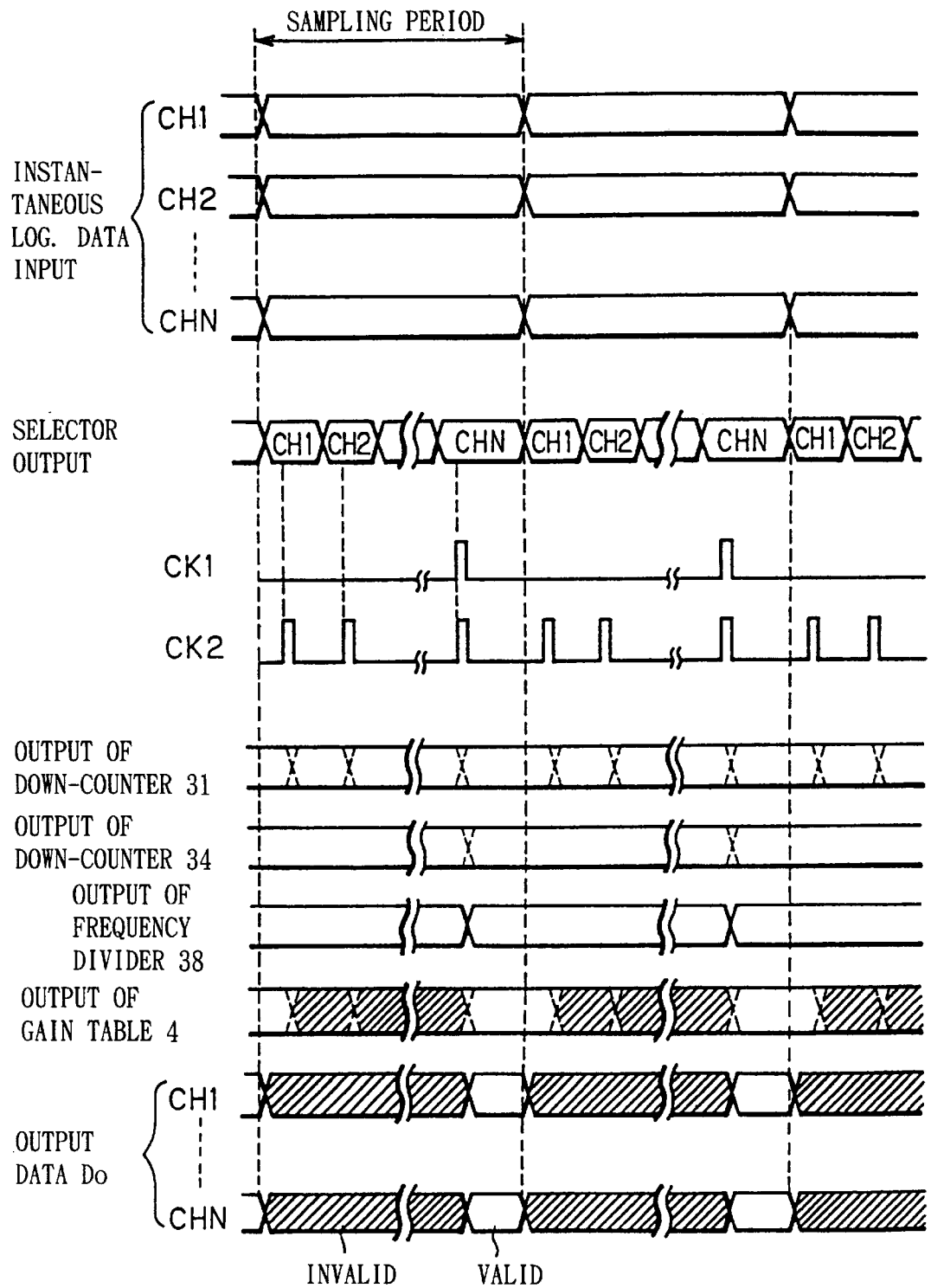
FIG. 14 is a timing chart explanatory of the operation of a peak-hold/timewise attenuation circuit in the embodiment of FIG. 13.

FIG. 14 shows the operation timing of the circuit. For one sampling period, the clock signal CK2 occurs once as in the case where the signal input/output system has only a single channel, while the clock signal CK1 successively occurs plural times equivalent to the number of the channels in synchronism with channel switching action of the selector 7. Thus, the comparator 32 of FIG. 6 also successively performs the above-mentioned comparison plural times equivalent to the number of the input channels, and the down-counter 31 ultimately holds its count for the last sampling period and the greatest value of logarithmic levels in all the input channels. The other operation will be substantially the same as in the single-channel embodiment. It is also to be noted that, the last-stage multiplication may be performed on a time-divisional basis using the single multiplier.

According to the embodiments described above, because calculation of an approximate envelope is performed in logarithmic code region, operations corresponding to exponential functional attenuation in linear region can be realized by the use of a simple down-counter. Further, the word lengths of logarithmic level data are considerably shortened as compared to those in the original linear region, it is possible to designate wider-range characteristics even with respect to signals of a wide dynamic range, using a gain table that is by far small-scale as compared to a gain table referred to by signals in linear region.

The signal processing device of the present invention also operates as an acoustic-signal-effect imparting device (effector) in the following manner.

To achieve nonlinear effect as an effector, the device can provide, for each sample, a gain corresponding to the amplitude of instantaneous data, by minimizing the hold-time and subsequent decay time during timewise attenuation (to zero), or by omitting the timewise attenuation circuit itself. Also in this case, real-time processing can be realized.

Figure 15:
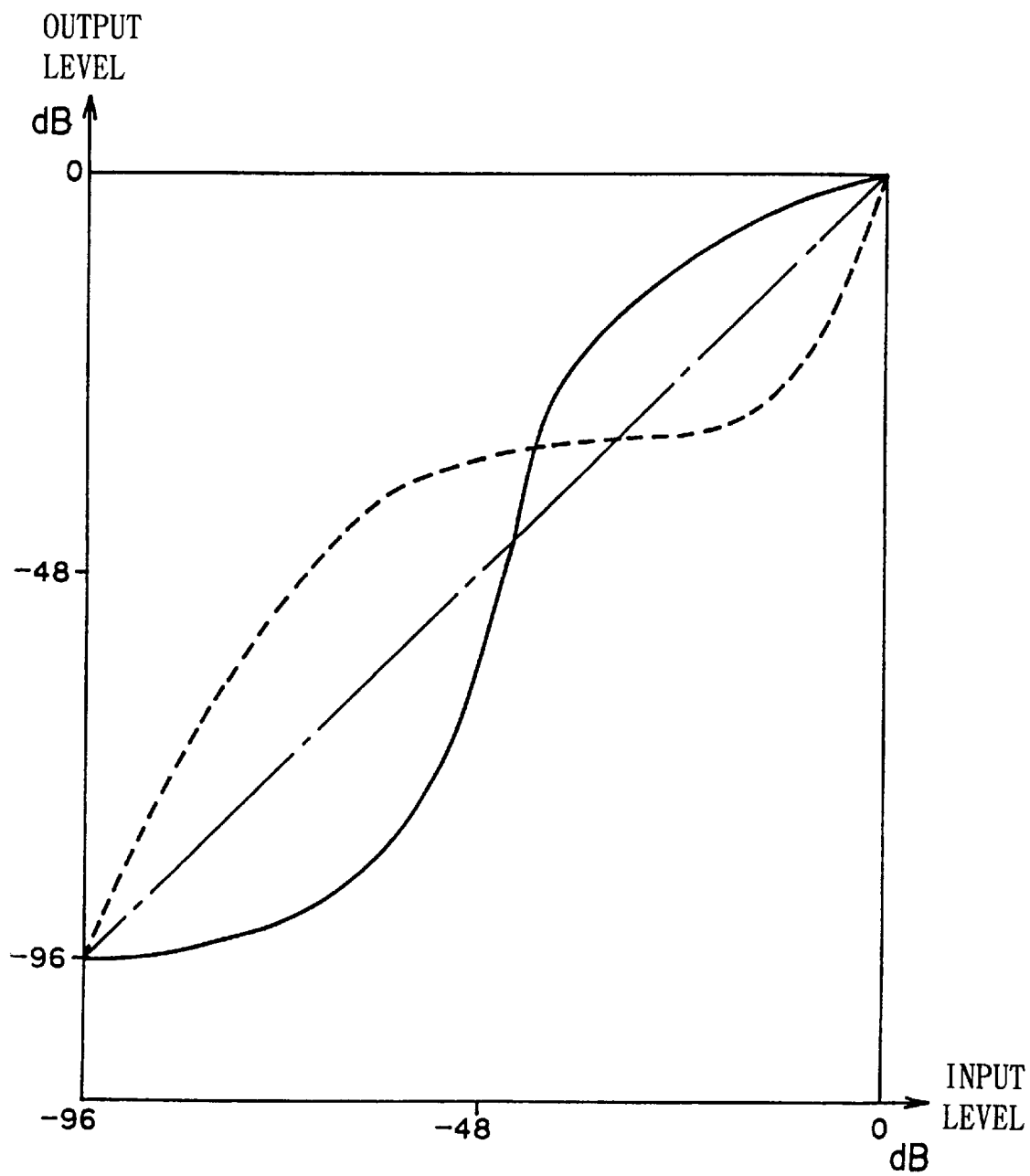
FIG. 15 shows an input-output characteristic of a digital signal processing device in accordance with still another embodiment of the present invention.

FIG. 15 shows an example of an input-output characteristic in the case where the digital signal processing device is employed as an effector in performance of an electronic musical instrument. With the above-mentioned arrangement, such as effector can also be realized by only rewriting the gain table 4 and changing parameters to be given to the peak-hold/timewise attenuation circuit 3.

As has been described thus far, the present invention provide gain characteristic using a gain table and thus can achieve complex gain characteristic with utmost ease. Further, by the use of the gain table to which digital signal expressed in logarithmic or floating-point representation is input as a readout address, the present invention can properly process signals of a wide dynamic range by means of a small-scale gain table.

What is claimed is:

1. A digital signal processing device comprising:
   receiving means for receiving a digital input signal to be processed, the digital input signal having a linear gain characteristic;
   logarithm conversion means for converting the input digital signal into logarithmic data, the logarithmic data having a non-linear gain characteristic;
   address generation means for generating a readout address based on the logarithmic data generated by said logarithm conversion means;
   memory means for storing a plurality of gain values on the basis of a predetermined gain characteristic, one of the plurality of gain values being read from the memory means as a chosen gain value in response to the readout address generated by said address generation means; and
   multiplication means for multiplying the digital input signal by the chosen gain value to provide a digital output signal,
   wherein no multiplication is performed in generating the chosen gain value from the digital input signal.

2. The digital signal processing device as defined in claim 1, further comprising rectifying means coupled to said receiving means for rectifying the digital input signal and for providing a rectified signal as the digital input signal to said logarithm conversion means.

3. The digital signal processing device as defined in claim 1, wherein said address generation means comprises a peak-hold/timewise attenuation device for peak-holding and timewise attenuating the logarithmic data generated by said logarithm conversion means to generate the readout address.

4. The digital signal processing device as defined in claim 1, wherein said storing means comprises a random access memory.

5. The digital signal processing device as defined in claim 1, wherein the logarithm conversion means consists of selection circuitry and logic gates.

6. The digital signal processing device as defined in claim 1, wherein the chosen gain value is generated without performing any actual mathematical computations.

7. A digital signal processing device comprising:
   means for receiving a digital input signal to be processed, the input digital signal having a linear gain characteristic;
   a rectifier for rectifying the digital input signal;
   a logarithm conversion device for converting a digital signal rectified by said rectifier into logarithmic data without performing multiplication, the logarithmic data having a non-linear gain characteristic;
   peak-hold/timewise attenuation device for peak-holding and timewise attenuating the logarithmic data converted by said logarithm conversion device to provide a readout address; and
   a gain table for storing a plurality of gain values on the basis of a predetermined gain characteristic, one of the plurality of gain values being read out from the gain table as a chosen gain value in response to the readout address generated by said peak-hold/timewise attenuation device; and
   a multiplier for multiplying the digital input signal by the chosen gain value to provide a digital output signal.

8. The digital signal processing device as defined in claim 7, wherein said peak-hold/timewise attenuation device includes a counter whose output is provided as the readout address.

9. A digital signal processing device comprising:
   means for receiving a digital input signal to be processed, the input digital signal having a linear gain characteristic;
   a gain table for generating a gain value in response to the digital input signal, the gain value being determined on the basis of a predetermined nonlinear gain characteristic and being generated without performing multiplication; and
   multiplication means for multiplying the digital input signal by the gain value generated by the gain table to provide a digital output signal, wherein the gain value is generated based on a logarithmic conversion of the digital input signal, the gain table is stored in a memory device, and the gain value is generated by providing the logarithmically converted digital input signal as an address for the memory device.

10. The digital signal processing device as defined in claim 9, wherein the gain table is stored in a RAM so that the non-linear gain characteristic is alterable.

11. The digital signal processing device as defined in claim 9, wherein the gain table is stored in a ROM.

12. A digital signal processing device comprising:

means for receiving a digital input signal to be processed, the input digital signal having a linear gain characteristic;

a gain table for storing a plurality of gain values on the basis of a predetermined gain characteristic, the input digital signal being converted to intermediate data having a non-linear gain characteristic without performing any multiplication, and one of the gain values in the gain table being selected based on the intermediate data;

multiplication means for multiplying the digital input signal by the selected gain value to provide a digital output signal and;

including four selectors and three OR gates, wherein each selector performs a selection operation such that Yi equals Bi when SB=1, and Yi equals Ai when SB=0, whereby 16-bit linear data is converted to 8-bit logarithmic data.

13. The digital signal processing device as claimed in claim 12, wherein when a first-stage selector sets output $Q_7$ to "1" and selects $D_{14}$ to $D_3$ to be input from input terminals $B_{11}$ to $B_0$ if data "1" is present at any one of eight bits $D_{14}$ to $D_7$, and said first stage selector sets output $Q_7$ to "0" and selects $D_6$, $D_5$, $D_4$, $D_3$, $D_2$, $D_1$ and $D_0$ and 0, 0, 0, 0, 0 to be input from input terminals A11 to A0 if data "1" is not present at any of the eight bits $D_{14}$ to $D_7$.

14. The digital signal processing device as claimed in claim 13, wherein a second stage selector selects either $Y_{11}$ to $Y_4$ or $Y_7$ to $Y_0$ depending on whether or not data "1" is present at any of the upper four bits $Y_{11}$ to $Y_8$.

15. The digital signal processing device as claimed in claim 14, wherein a third stage selector selects either $Y_7$ to $Y_2$ or $Y_5$ to $Y_0$ depending on whether or not data "1" is present at any of the upper two bits $Y_7$ and $Y_6$; and, a fourth stage selector selects either $Y_5$ to $Y_1$ or $Y_4$ to $Y_0$ depending on whether or not the upper bit "1" $Y_5$ is at "1".

16. A digital signal processing device comprising:

means for receiving a digital input signal to be processed, the input digital signal having a linear gain characteristic;

a gain table for storing a plurality of gain values on the basis of a predetermined gain characteristic, the input digital signal being converted to intermediate data having a non-linear gain characteristic without performing any multiplication, and one of the gain values in the gain table being selected based on the intermediate data; and multiplication means for multiplying the digital input signal by the selected gain value to provide a digital output signal, wherein an input signal level is gain-controlled according to the following steps:

if an intermediate-level signal of from about −24 db to about −84 db is input, an input-output gain of +12 bd is increased;

if a high-level signal of more than −24 is input, compression at a 2 compression ration is performed to prevent clipping; and if a low level signal of less than about −84 is input, expansion of a 2 expansion ratio is performed to suppress low-level noise with no signal.

17. A method for digital signal processing comprising:

receiving a digital signal to be input, whereby said digital signal has linear gain characteristics;

converting the digital signal into logarithmic data, whereby said logarithmic data has linear gain characteristics;

generating a readout address based on said converted logarithmic data;

storing a plurality of gain values on the basis of a predetermined gain characteristic, wherein one of the plurality of gain values is read from a memory means as a chosen gain value in response to said readout address generated based on said converted logarithmic data; and, multiplying the input signal by the chosen gain value for providing a digital output signal without performing multiplication in generating the chosen gain value from the digital input signal.

18. A digital signal processing method, comprising the steps of:

receiving a digital signal to be input, whereby said digital signal has linear gain characteristics;

rectifying the digital input signal;

converting the rectified digital signal into logarithmic data without performing multiplication, wherein said logarithmic data has non-linear gain characteristics;

peak-holding and timewise attenuating the logarithmic data converted to provide a readout address;

storing a plurality of gain values on the basis of a predetermined gain characteristic, wherein one of the plurality of gain values is read out from the gain table as a chosen gain value in response to the readout address; and, multiplying the digital input signal by the chosen gain value for providing a digital output signal.

* * * * *